United States Patent
Guguschev et al.

(10) Patent No.: US 11,591,712 B2
(45) Date of Patent: Feb. 28, 2023

(54) METHOD AND SETUP FOR GROWING BULK SINGLE CRYSTALS

(71) Applicants: Forschungsverbund Berlin e.V., Berlin (DE); Cornell University, Ithaca, NY (US)

(72) Inventors: Christo Guguschev, Berlin (DE); Mario Brutzam, Berlin (DE); Darrell Schlom, Ithaca, NY (US); Hanjong Paik, Ithaca, NY (US)

(73) Assignees: FORSCHUNGSVERBUND BERLIN E.V., Berlin (DE); CORNELL UNIVERSITY, Ithaca, NY (US)

( * ) Notice: Subject to any disclaimer, the term of this patent is extended or adjusted under 35 U.S.C. 154(b) by 878 days.

(21) Appl. No.: 16/424,987

(22) Filed: May 29, 2019

(65) Prior Publication Data

US 2020/0378030 A1    Dec. 3, 2020

(51) Int. Cl.
*C30B 15/14*    (2006.01)
*C30B 15/10*    (2006.01)
(Continued)

(52) U.S. Cl.
CPC ............ *C30B 15/14* (2013.01); *C30B 11/002* (2013.01); *C30B 11/003* (2013.01);
(Continued)

(58) Field of Classification Search
CPC ... C30B 11/002; C30B 11/003; C30B 11/006; C30B 11/02; C30B 15/10; C30B 15/14;
(Continued)

(56) References Cited

U.S. PATENT DOCUMENTS 9,738,990 B2    8/2017  Xu et al.
2004/0206296 A1*  10/2004  Lee .................... C30B 11/00
                                                        117/2
(Continued)

FOREIGN PATENT DOCUMENTS

DE     102010021203 A1    11/2011
JP         63-225572    *  9/1988  ............. C04B 35/00
(Continued)

OTHER PUBLICATIONS

Barnes et al, Structure determination of A2M3+TaO6 and A2M3+NbO6 ordered perovskites: octahedral tilting and pseudosymmetry, Acta. Cryst. (2006), B62, p. 384-396 (Year: 2006).*

(Continued)

*Primary Examiner* — Matthew J Song
(74) *Attorney, Agent, or Firm* — Ware, Fressola, Maguire & Barber LLP

(57) ABSTRACT

The invention relates to a method for growing a bulk single crystal, wherein the method comprises the steps of
  inserting a starting material into a crucible,
  melting the starting material in the crucible by heating the starting material,
  arranging a thermal insulation lid at a distance above a melt surface of said melt such that at least a central part of the melt surface is covered by the lid, and
  growing the bulk single crystal from the melt by controllably cooling the melt with the thermal insulation lid arranged above the melt surface.

20 Claims, 10 Drawing Sheets

(51) Int. Cl.
  *C30B 29/68* (2006.01)
  *C30B 29/22* (2006.01)
  *C30B 11/00* (2006.01)
  *C30B 11/02* (2006.01)
  *C30B 29/64* (2006.01)
  *C30B 29/30* (2006.01)

(52) U.S. Cl.
  CPC ............ *C30B 11/006* (2013.01); *C30B 11/02* (2013.01); *C30B 15/10* (2013.01); *C30B 29/22* (2013.01); *C30B 29/68* (2013.01); *C30B 29/30* (2013.01); *C30B 29/64* (2013.01)

(58) Field of Classification Search
  CPC ......... C30B 29/22; C30B 29/30; C30B 29/64; C30B 29/68
  See application file for complete search history.

(56) References Cited

U.S. PATENT DOCUMENTS

| | | | | |
|---|---|---|---|---|
| 2011/0034336 | A1* | 2/2011 | Goyal | C30B 23/02 427/63 |
| 2017/0314156 | A1 | 11/2017 | Fratello | |
| 2020/0185529 | A1* | 6/2020 | Park | H01L 51/0018 |

FOREIGN PATENT DOCUMENTS

| | | |
|---|---|---|
| JP | H05-294783 A | 11/1993 |
| JP | 2016-222471 A | 12/2016 |
| KR | 10-0430751 B1 | 5/2004 |

OTHER PUBLICATIONS

Korean Office Action dated Aug. 28, 2021 issued by the Korean Intellectual Property Office in corresponding KR Application No. 10-2020-0065462, 13 pages with unofficial English translation.

Schlom, "Progress toward Taming BaSnO3: Substrates, Films, and Transistors", Paul Drude Institut 2019, 1 page.

Kim et al., "High Mobility in a Stable Transparent Perovskite Oxide", Appl. Phys. Express 5 (2012) 061102-1 through 061102-3.

Korean Office Action; Issued by the Korean Patent Office in parallel Korean patent application dated Aug. 19, 2022 5 pages.

Rameshe, et al; "First principle study on electronic structure, structural phase stability, optical and vibrational properties of Ba2ScMO6 (M=Nb, Ta)"; International Journal of Modern Physics B; vol. 29; 2015; pp. 1550246-1 through 1550246-16.

* cited by examiner

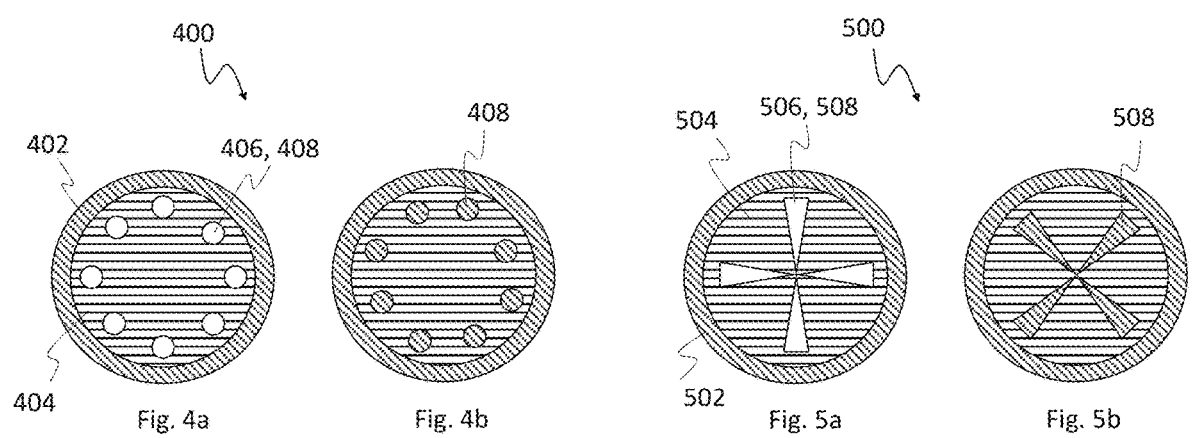

METHOD AND SETUP FOR GROWING BULK SINGLE CRYSTALS

STATEMENT REGARDING FEDERALLY SPONSORED RESEARCH

This invention was made with government support under Grant No. FA9550-16-1-0192 awarded by the United States Air Force. The government has certain rights in the invention.

TECHNICAL FIELD

The invention relates to a growth method and to a growth setup for growing a bulk single crystal and applications thereof.

BACKGROUND OF THE INVENTION

For fabrication of electronic devices, often a stack of crystal layers is grown layer upon layer on top of a single crystal substrate. To grow the crystal layers as epitaxial films having a well-defined crystallographic orientation with respect to the single crystal substrate, typically, it is required that the lattice parameter of the substrate is compatible with the respective lattice parameters of the crystal layers.

Thus, for fabricating an electronic device, typically, a suitable single crystal substrate has to be selected that has a lattice parameter that approximately matches—e.g., lattice matching better than 1%—the lattice parameters of the crystal layers to be grown on the substrate.

A widely established technique for growing bulk single crystals from which single crystal substrates can be fabricated is the Czochralski process. In the Czochralski process a starting material is melted in a crucible and a seed crystal is dipped into the melt. To grow a bulk single crystal, the seed crystal is rotated and simultaneously slowly pulled upwards. Thereby, large bulk single crystals in the shape of cylindrical ingots or boules can be grown and subsequently processed to, e.g., substrates that can be used in the electronics industry to make electronic devices. However, the Czochralski process does not work for all materials.

SUMMARY OF THE INVENTION

It is an object of the invention to provide an alternative method for growing a bulk single crystal and to provide an alternative growth setup for growing a bulk single crystal.

Regarding the growth method, the object is achieved by a method for growing a bulk single crystal comprising the steps of
  inserting a starting material into a crucible,
  melting the starting material in the crucible by heating the starting material,
  arranging a thermal insulation lid at a distance above a melt surface of said melt such that at least a central part of the melt surface is covered by the lid, and
  growing the bulk single crystal from the melt by controllably cooling the melt with the thermal insulation lid arranged above the melt surface.

Of these method steps, the step of "arranging a thermal insulation lid" can be conducted before melting the starting material to a melt or while melting the starting material to a melt or after melting the starting material to a melt. However, it is required that the thermal insulation lid is arranged above the melt during the growth of the bulk single crystal from the melt.

Within the framework of this invention a bulk single crystal is a single crystal having a volume of at least 5 mm×5 mm×5 mm (length×width×height).

The thermal insulation lid is configured for blocking thermal radiation that is emitted at least from the part of the melt surface that is covered by the thermal insulation lid. Since the thermal insulation lid is arranged at a distance above the melt surface of the melt, a temperature distribution in the melt held inside the crucible can be influenced. By way of arranging the thermal insulation lid above the melt surface it is thus possible to design the temperature distribution in the melt.

The invention includes the recognition that for fabricating electronic devices typically single crystal substrates are required at standard wafer sizes, e.g., 5 mm×5 mm or 10 mm×10 mm or 1-inch, 2-inch, 3-inch, 4-inch, 6-inch and 8-inch diameter wafers, that are chemically stable, that are structurally compatible with crystal layers to be grown on the substrate and that have good structural quality. In particular, the requirement of good structural quality of the single crystal substrate can be challenging to achieve for certain substrate materials. However, good structural quality of the substrate is needed to be able to grow crystal layers on top of it with likewise high crystal quality and thus impeding defects that would degrade the functionality of the layer.

Yet, for various materials no such suitable single crystal substrate with high structural quality is available. The result is that many materials with beneficial material properties are not used in the electronics industry up to now. In fact, for the fabrication of electronic devices the availability of suitable single crystal substrates often constitutes a major bottleneck.

With the method for growing a bulk single crystal according to the invention, bulk single crystals with high structural quality can be grown having sizes enabling the fabrication of single crystal substrates at standard wafer-sizes.

It is a particular advantage of the method that even such bulk single crystals can be grown in a convenient manner that cannot easily be grown by implementing the widely used Czochralski process. Such bulk single crystals that cannot easily be grown in a Czochralski process, e.g., oxide crystals that show intense infrared absorption and very low thermal conductivity at high temperatures, typically suffer from growth instabilities like, e.g., diameter fluctuations, foot formation and subsequent spiraling shortly after the seeding stage in a Czochralski process.

Thus, with the method for growing a bulk single crystal according to the invention access is provided to fabricating single crystal substrates made of materials that were not available to the electronics industry with suitable size and needed structural quality before. As a beneficial consequence of this invention, additional single crystal substrates will become available on which crystal layers can be grown that are made of materials for which no structurally and chemically compatible substrate was previously available in the electronics industry.

This is achieved by arranging the thermal insulation lid at a distance above the melt for growing the bulk single crystal. By arranging the thermal insulation lid such that at least a central part of the melt surface is covered by the lid, thermal insulation is provided to block thermal radiation emitted from the melt surface and, thus, to influence and to design the temperature distribution in the melt held inside the crucible. By means of the thermal insulation lid, the temperature distribution in the melt can be controlled during growth of the bulk single crystal from the melt. By influencing the temperature distribution in the melt by means of the thermal insulation lid, a bulk single crystal can be grown from the melt that has high structural quality and a size suitable for fabricating single crystal substrates with standard wafer sizes.

As a result of arranging the thermal insulation lid while growing the bulk single crystal such that at least a central part of the melt surface is covered by the lid, the bulk single crystal grows towards the central region of the crucible. In fact, while controllably cooling the melt crystals nucleate at the crucible wall and grain-selection and continuous grain enlargement proceeds as the growth front moves towards the central part of the crucible.

This growth behavior contrasts what is generally known and, thus, what is expected for growth of bulk single crystals using commonly known growth methods—such as the widely used Czochralski process—where the bulk single crystal grows from the central part of the crucible towards the crucible wall, without touching it during the entire growth process.

In the following preferred variants of the method for growing a bulk single crystal according to the invention are described.

Preferably, the cooling of the melt is passively controlled by reducing heat provided by a heating element over a predefined period of time. For example, the power supplied by a generator to the heating element can be reduced continuously or stepwise over a predefined period of time such that the heat coupled into the crucible decreases. Thereby, the melt cools and the bulk single crystal grows from the crucible wall towards the central part of the crucible. The cooling rate of the melt is determined by the heat loss from the crucible and the melt over time, the material of which the crucible is made, the crucible geometry as well as the geometry of the thermal insulation lid and the general thermal insulation next to the crucible. The predefined period of time over which the provided heat is reduced can comprise, e.g., 10 to 50 hours.

Additionally or alternatively to passively controlled cooling of the melt, the cooling can also be controlled actively. Active cooling can, e.g., be implemented by directing an inert gas flux, e.g. an argon gas flux onto the melt. Active cooling involves for example using a sensor in a feedback loop, e.g., a temperature sensor for measuring the local temperature close to the surface of the melt. The advantage is that active and automated cooling can be controlled and adjusted, e.g., in a feedback loop based on a parameter repeatedly measured with a respective sensor.

It is preferred that the distance at which the thermal insulation lid is arranged above the melt surface of the melt is between 1 mm, i.e., just not touching the melt, and 100 mm. In particular, it is advantageous if the distance at which the thermal insulation lid is arranged above the melt surface is 10 mm or at least between 5 mm and 20 mm. By adjusting the distance at which the thermal insulation lid is arranged above the melt surface a suitable temperature distribution inside the melt can be designed and, thus, the distance can be used as a control parameter for controlling the growth of the bulk single crystal, e.g., the growth rate and the direction of crystal growth.

It is preferred that the distance between the lid and the melt surface is kept constant while growing the bulk single crystal. However, it can also be advantageous if the distance is varied while growing the bulk single crystal to adjust the temperature distribution in the melt, e.g., for different growth stages. It is further preferred that the lid is arranged parallel to or at least approximately parallel to the melt surface of the melt such that the distance between lid and melt surface is constant over the area of the thermal insulation lid. However, in some growth scenarios it is advantageous if the lid is tilted with respect to the melt surface to impart a particular temperature distribution in the melt.

The thermal insulation lid can be attached to a mounting and by moving the mounting vertically with respect to the melt surface the distance from the thermal insulation lid to the melt surface can be adjusted. Such an arm can be movable manually or automatically.

For the described growth method, it is not required that the thermal insulation lid is arranged exactly centered with respect to the crucible. The growth method also works if at least a central part of the melt surface is covered with the lid. Thus, the thermal insulation lid and in particular the rim of the lid can be in contact with the crucible wall.

Preferably, the starting material is provided in powder form with a purity of 99.99%. However, also impurities in the 1% range and dopants in the 5% range are tolerable.

The starting material can be composed of only one or two chemical species, however, in most cases the starting material is composed of various chemical species. It is advantageous if a powder mixture is produced from the starting material, e.g., including weighing, mixing and calcining the powders of the different chemical species.

If the starting material is in powder form, it is preferred that the powder is a dried powder.

Further, to improve the filling of the starting material into the crucible as well as the melting of the starting material in the crucible it is preferred that the powder is compacted before being inserted into the crucible if the starting material is in powder form. By compacting the powder, typically, the fewest heat/cooling cycles are necessary to fill the crucible before being able to begin crystal growth. For example, the powder, e.g., a powder mixture, can be pressed. Advantageously one or several bars, flakes or balls can be produced from the powder by cold isostatic pressing. Cold isostatic pressing can be performed, e.g., at 0.2 GPa. If one bar is produced, the bar typically extends beyond the top of the crucible and sinks into the crucible while melting. Such a bar of compacted powder, preferably, has a total mass that is calculated to fill the crucible when melted and has a shape that fits into the crucible, but extends up and out of the crucible.

The starting material can also be inserted into the crucible as a loose powder and subsequently compacted inside the crucible before melting. The pressing is then uniaxial. It is preferred to press the powder before inserting it into the crucible to avoid potential damage to the crucible.

However, compacting the starting material is not necessary for growing a bulk crystal from the melt. Thus, the powder could be directly placed into the crucible and heated to melt it, Filling can then comprise several steps of adding powder.

It is preferred that the crucible is arranged in an inert gas atmosphere, preferably, under ambient pressure. The inert gas atmosphere can be an argon or a nitrogen atmosphere. However, it is also possible for the growth method to work in vacuum or high pressure, e.g., up to several hundred atmospheres where argon becomes a superfluid. Preferably, the inert gas atmosphere is established before the crucible is heated and the inert gas atmosphere is present during the entire melting process and during crystal growth. Typically, a few percent of oxygen is tolerable. When using an iridium or another oxidizing material as the crucible material, it is preferred that most of the air is displaced by an inert gas like, e.g., argon.

In various variants of the growth method according to the invention the starting material comprises oxygen in combination with at least one of a cation species that can assume multiple oxidation states and the bulk single crystal grown comprises an oxide that contains at least one of a cation species that can assume multiple oxidation states, or more preferably at least one of titanium, vanadium, chromium, manganese, iron, cobalt, nickel, copper, niobium, molybdenum, tungsten, or tantalum and the bulk single crystal comprises an oxide, preferably an oxide of titanium, vanadium, chromium, manganese, iron, cobalt, nickel, copper, niobium, molybdenum, tungsten, or tantalum.

Especially for these materials bulk single crystals of sufficient quality cannot be grown with known methods. Thus, the invention provides for the first time bulk single crystals of these materials and a method for growing them. The invention is based on the recognition that bulk single crystals of these materials can be grown by using a thermal insulation lid arranged at a distance above a melt surface of the melt such that at least a central part of the melt surface is covered by the lid during the cooling of the melt and thus during growth.

It is particularly preferred that the starting material comprises at least Ba, Sc, Nb and O and the resulting bulk single crystal is a bulk $Ba_2ScNbO_6$ single crystal.

In particular, the fabrication of bulk $Ba_2ScNbO_6$ single crystals is preferred as these bulk $Ba_2ScNbO_6$ single crystals can be processed to $Ba_2ScNbO_6$ single crystal substrates. Such $Ba_2ScNbO_6$ single crystal substrates—up to now—are not available in the electronics industry at the sizes and structural quality needed.

A bulk $Ba_2ScNbO_6$ single crystal is a double-perovskite having cubic symmetry. The lattice parameter of a bulk $Ba_2ScNbO_6$ single crystal is within 1% of the lattice parameter of various perovskites—like $BaSnO_3$—for which up to now no suitable substrate was available in the electronics industry for fabricating electronic devices comprising crystal layers of these materials with the low defect densities needed for high performance. Thus, the invention provides a bulk $Ba_2ScNbO_6$ single crystal for fabricating a substrate, which then allows the fabrication of electronic devices of materials, which were not available in high quality form for the electronics industry up to now, but which are, due to their expected high performances demanded.

Preferably, the starting material comprising at least Ba, Sc, Nb and O is provided in dried powder form with purities of 99.99%. Additionally to Ba, Sc, Nb and O, the starting material can comprise MgO and/or CaO at a content of less than 5 mol %. MgO and/or CaO can thus be added as dopants in order to reduce the free carrier absorption at high temperatures by a mechanism known as compensation doping. When adding one or both of these dopants to the starting material the resulting bulk single crystal then is a bulk $Ba_2ScNbO_6$ single crystal that is doped with Mg and/or Ca.

If the starting material comprises at least Ba, Sc, Nb and O and the bulk single crystal to be grown is a bulk $Ba_2ScNbO_6$ single crystal, the method for growing a bulk single crystal according to the invention correspondingly includes the steps of inserting a starting material comprising at least Ba, Sc, Nb and O into a crucible, melting the starting material in the crucible by heating the starting material, arranging a thermal insulation lid at a distance above a melt surface of said melt such that at least a central part of the melt surface is covered by the lid, and growing the bulk $Ba_2ScNbO_6$ single crystal from the melt by controllably cooling the melt with the thermal insulation lid arranged above the melt surface.

The step of "inserting a starting material" comprises in an embodiment the sub steps of producing a powder mixture from the starting material comprising at least Ba, Sc, Nb and O, compacting the powder mixture comprising at least Ba, Sc, Nb and O, and inserting the compacted powder mixture into the crucible.

The sub-step of "producing a powder mixture from the starting material comprising at least Ba, Sc, Nb and O" can comprise weighing, mixing and calcining the starting material. Calcining the starting material—preferably provided in dried powder form—can be performed, e.g., in air at 1300° C. for 12 hours.

The sub-step of "compacting the powder mixture comprising at least Ba, Sc, Nb and O" can comprise producing one or more bars from the powder mixture by cold isostatic pressing at 0.2 GaP.

For melting the starting material comprising at least Ba, Sc, Nb and O it is sufficient if the crucible is heated to a temperature that is at least as high as the melting temperature of a bulk $Ba_2ScNbO_6$ single crystal. The crucible can for example be heated to a temperature of at least 2165 +/−30° C. To be well above the melting temperature the crucible can be heated to a temperature of at least 2195° C., e.g., a temperature of 2200° C.

For growing a bulk $Ba_2ScNbO_6$ single crystal it is beneficial if an inert gas atmosphere in which the crucible is arranged has a pressure of 1 atm or even higher than 1 atm to decrease the effective evaporation rate of BaO.

A bulk $Ba_2ScNbO_6$ single crystal grown according to the method described herein can at least partly be surrounded by a multicrystalline or polycrystalline matrix that grows in the initial stage of the growth process according to the invention close to the crucible wall.

Therefore, in particular the method for growing a bulk $Ba_2ScNbO_6$ single crystal can comprise the step of separating the bulk $Ba_2ScNbO_6$ single crystal from a multicrystalline or polycrystalline matrix that at least partly surrounds the bulk $Ba_2ScNbO_6$ single crystal. Separating comprises in one embodiment cutting and/or grinding and/or cleaving to isolate the bulk $Ba_2ScNbO_6$ single crystal.

In particular, for fabricating a $Ba_2ScNbO_6$ single crystal substrate a slice of the bulk $Ba_2ScNbO_6$ single crystal can be cut. From a $Ba_2ScNbO_6$ single crystal grown according to the method described herein slices can be cut having a diameter in lateral extent that is equal to or larger than 6 mm. With the method described herein it is also possible to grow a $Ba_2ScNbO_6$ single crystal from which a slice can be cut having a diameter in lateral extent that is equal to or larger than 8 mm or even equal to or larger than 10 mm. A slice cut from a $Ba_2ScNbO_6$ single crystal can be further processed to a $Ba_2ScNbO_6$ single crystal substrate for use in the electronics industry.

Advantageously, from the slice a $Ba_2ScNbO_6$ single crystal substrate is fabricated having a diameter in lateral extent that is equal to or larger than 6 mm. From a slice having a diameter in lateral extent that is equal to or larger than 8 mm a substrate can be fabricated having a diameter in lateral extent equal to or larger than 8 mm. From a slice having a diameter in lateral extent that is equal to or larger than 10 mm it is possible to fabricate a substrate having a diameter in lateral extent that is equal to or larger than 10 mm.

The invention also relates to a bulk $Ba_2ScNbO_6$ single crystal having a cross-sectional area that is equal to or larger than 6 mm×6 mm. The invention further relates to a bulk $Ba_2ScNbO_6$ single crystal having a cross-sectional area that is equal to or larger than 8 mm×8 mm, in particular, equal to or larger than 10 mm×10 mm. The bulk $Ba_2ScNbO_6$ single crystal can be realized independently of other aspects described herein and thus constitutes an invention on its own.

The bulk $Ba_2ScNbO_6$ single crystal according to the invention has cubic symmetry and a lattice parameter of 412 pm. Therefore, a bulk $Ba_2ScNbO_6$ single crystal has a compatible lattice parameter with many materials of interest to the electronics industry, such as $BaSnO_3$ which also has the perovskite structure with identical Ba—O layers. In fact, $Ba_2ScNbO_6$ and $BaSnO_3$ are lattice matched within better than 0.1%. Further, $Ba_2ScNbO_6$ has a dielectric constant of 16 and a bandgap of 3.6 eV, thus, having material properties often required for a suitable substrate in the electronics industry. The bulk $Ba_2ScNbO_6$ single crystal has a melting point at 2165+/−30° C. in an inert gas atmosphere at ambient pressure.

Preferably, the bulk $Ba_2ScNbO_6$ single crystal has a composition of 66.7 mol % +/−5% of BaO, 16.7 mol % +/−5% of $Sc_2O_3$ and 16.7 mol % +/−5% of $Nb_2O_5$. However, the melt from which the bulk $Ba_2ScNbO_6$ single crystal has been grown, e.g., by means of the method for growing a bulk single crystal according to the invention, does not need to have the same composition as the bulk $Ba_2ScNbO_6$ single crystal. Related methods of crystal growth, e.g., top-seeded solution growth (TSSG), can be used for providing a melt containing Ba, Sc, Nb, and O from which the bulk $Ba_2ScNbO_6$ single crystal can be grown by means of the method for growing the bulk single crystal according to the invention. A flux of another species, e.g., based on $Cu_2O$ or $PbO/PbF_2$, can be present in the melt, but, preferably, the flux used is one that only incorporates minimally in the bulk single crystal grown from the melt. Other species that can take the place of MgO can be, e.g., CaO, but the content of such dopants, preferably, is restricted to less than 5 mol %.

The invention also relates to a single crystal $Ba_2ScNbO_6$ substrate having a diameter in lateral extent that is equal to or larger than 6 mm. The invention also relates to a single crystal $Ba_2ScNbO_6$ substrate having a diameter in lateral extent that is equal to or larger than 8 mm, in particular, equal to or larger than 10 mm. In particular, the invention also relates to a single crystal $Ba_2ScNbO_6$ substrate having standard wafer sizes, e.g. having lateral extents of 4-inch or 6-inch. Such single crystal $Ba_2ScNbO_6$ substrates can be fabricated from the bulk $Ba_2ScNbO_6$ single crystal according to the invention having a respective cross-sectional area.

The invention also relates to a (multi)layer structure comprising a single crystal $Ba_2ScNbO_6$ substrate according to the invention and one or more crystal layers grown on said $Ba_2ScNbO_6$ substrate. This (multi)layer structure can be realized independently of other aspects described herein and thus constitutes an invention on its own.

The single crystal $Ba_2ScNbO_6$ substrate according to the invention has a lattice parameter making it a suitable substrate in the electronics industry for various materials and, in particular, for materials for which no suitable substrate was available before at sizes and structural quality needed to maintain the functionality of these materials.

It is a particular advantage that the single crystal $Ba_2ScNbO_6$ substrate has a lattice parameter matching the lattice parameter of various perovskites. For example, the one or more crystal layers grown on the single crystal $Ba_2ScNbO_6$ substrate can comprise at least one of the perovskites $BaSnO_3$, $LaInO_3$, $BiScO_3$, $PbZrO_3$, $SrZrO_3$, $SrHfO_3$, $PrInO_3$, $LaScO_3$, $SrSnO_3$, $BaHfO_3$, $LaLuO_3$, $CeLuO_3$, $PrLuO_3$, $NdLuO_3$, $CeYbO_3$, $PrYbO_3$, or $BaZrO_3$.

The one or more crystal layers grown on the single crystal $Ba_2ScNbO_6$ substrate can also comprise at least one of the perovskite solid solutions $PbZr_{1-x}Ti_xO_3$ (PZT), $PbCa_{1-x}Ti_xO_3$ (PCT), or $Ba_{1-x}Sr_xSnO_3$, wherein x is a number between 0 and 1.

The one or more crystal layers can also comprise at least one of the relaxor-ferroelectric solid solutions $PbMg_{1/3}Nb_{2/3}O_3$—$PbTiO_3$ (PMN-PT), $PbZn_{1/3}Nb_{2/3}O_3$—$PbTiO_3$ (PZN-PT), and $PbIn_{1/2}Nb_{1/2}O_3$—$PbMg_{1/3}Nb_{2/3}O_3$—$PbTiO_3$ (PIN-PMN-PT).

If the multilayer structure comprises several crystal layers grown on the $Ba_2ScNbO_6$ substrate in different layers the multilayer structure can comprise, e.g., at least one of the perovskites listed above and/or at least one of the perovskite solid solutions listed above and/or at least one of the relaxor-ferroelectric solid solutions listed above.

It is particularly preferred that the multilayer structure comprises a $BaSnO_3$ crystal layer that is grown directly on the single crystal $Ba_2ScNbO_6$ substrate. With the highly lattice matched single crystal $Ba_2ScNbO_6$ substrate, the $BaSnO_3$ crystal layer shows good properties for the use in electronic devices. Advantageously, the $BaSnO_3$ crystal layer grown directly on the single crystal $Ba_2ScNbO_6$ substrate has an average threading dislocation density of less than $10^8$ dislocations per $cm^2$ and/or an electron mobility larger than 190 $cm^2V^{-1}s^{-1}$ and/or a full width at half maximum (FWHM) of its rocking curve that is less than or equal to 23 arcsec (0.006°).

Due its high electron mobility—that can be over 300 $cm^2V^{-1}s^{-1}$ when degenerately doped—at room temperature, its excellent transparency, its chemical stability, and because being free of indium, the transparent conducting oxide (TCO) $BaSnO_3$ provides a plurality of material properties beneficial for electronic devices. For example, field-effect transistors (FET) with $BaSnO_3$ have been demonstrated to operate at room temperature with peak field-effect mobilities of 61 $cm^2V^{-1}s^{-1}$ and $I_{on}/I_{off}$ ratios up to $10^9$.

However, up to now, no multilayer structures comprising a $BaSnO_3$ crystal layer were used in the electronics industry as no suitable substrate was available enabling fabricating a multilayer structure with a $BaSnO_3$ crystal layer at the crystal quality needed. Due to the lack of suitable substrates, in the prior art thin films of $BaSnO_3$ can only be grown with high dislocation densities on previously available substrates leading to significantly reduced electron mobilities. With the invention multilayer structures comprising a $BaSnO_3$ crystal layer are now available on a large scale with maintained functionality and thus beneficial properties.

The invention includes the recognition that by being able to grow bulk $Ba_2ScNbO_6$ single crystals, e.g., with the growth method according to the invention, and, thus, by being able to provide a $Ba_2ScNbO_6$ single crystal substrate having the needed structural compatibility as well as the needed structural quality, access is provided to fabricate multilayer structures comprising a $BaSnO_3$ crystal layer with high structural quality and, thus, maintained functionality. For example, directly on a $Ba_2ScNbO_6$ single crystal substrate a $BaSnO_3$ crystal layer having an average threading dislocation density of less than $10^8$ dislocations per $cm^2$ and an electron mobility larger than 190 $cm^2V^{-1}s^{-1}$ can be grown to fabricate a multilayer structure. The high structural quality results in a full width at half maximum (FWHM) of the rocking curve of the $BaSnO_3$ crystal layer that is equal to or even less than 23 arcsec (0.006°). These values are for example reached for a 250 nm thick undoped $BaSnO_3$ crystal layer followed by a 130 nm thick La-doped $BaSnO_3$ layer, doped to yield a free electron concentration of $3 \times 10^{19}$ $cm^{-3}$, on a $Ba_2ScNbO_6$ single crystal substrate.

It is a particular advantage of the (multi)layer structure comprising a $BaSnO_3$ crystal layer epitaxially grown on a $Ba_2ScNbO_6$ single crystal substrate, that the $BaSnO_3$ crystal layer can have a thickness of, e.g., 380 nm and more, still having an average threading dislocation density of less than $10^8$ dislocations per $cm^2$ and an electron mobility larger than $190\ cm^2V^{-1}s^{-1}$. In such a (multi)layer structure the crystal layer grown as an epitaxial $BaSnO_3$ film on $Ba_2ScNbO_6$ is fully commensurate even when growing a $BaSnO_3$ crystal layer having a thickness in excess of one micrometre.

The invention further relates to an electronic device comprising the (multi)layer structure according to the invention. The electronic device can be a device selected from: a field-effect transistor with a conventional gate dielectric (a MOSFET), a field-effect transistor with a ferroelectric gate dielectric (a ferroelectric FET), a field-effect transistor with an antiferroelectric gate dielectric (an antiferroelectric FET), a transducer, a receiver, an amplifier, a sensor, and an actuator. Because of the high bandgap of $BaSnO_3$, the aforementioned devices can be fully transparent, i.e., a transparent transistor, transparent transducer, transparent sensor, etc.

Transparent MOSFETs based on $BaSnO_3$ have been shown to have superior electrical performance to all prior transparent MOSFETs.

Ferroelectric FETs require no power to maintain their logic states, making them relevant to memory and instant-on computing. The logic state can be read out non-destructively based on the conductance of the semiconductor channel. These ferroelectric FETs were first proposed over 60 years ago, but their realization has been thwarted because of materials integration issues. An abrupt ferroelectric-to-semiconductor interface is crucial to the performance of these devices; unfortunately direct growth of ferroelectrics on mainstream semiconductors is accompanied by extensive interdiffusion or chemical reactions that degrade the properties of the oxide, the underlying semiconductor, or both, leading to electrically-active defects at the semiconductor/oxide interface. Such defects incapacitate these devices. The invention allows meeting this long-standing challenge and enabling a new generation of hyper-functional oxide electronics by utilizing $BaSnO_3$ as the high mobility channel layer in ferroelectric FETs because $BaSnO_3$ is structurally and chemically compatible with many ferroelectric and multiferroic oxides.

FETs containing ferroelectric or antiferroelectric gate dielectrics also have the potential to produce low-power transistors that can beat the 60 mV/decade subthreshold slope limit of conventional transistors.

The ability to produce high mobility $BaSnO_3$ channel layers made possible by this invention further makes it possible to fabricate "smart-FETs" by integrating the exceptional functionalities of chemically and structurally compatible perovskite oxides to make hyper-sensitive temperature, pressure, or magnetic field sensors.

Regarding the growth setup, the object of the invention is achieved by a growth setup for growing a bulk single crystal from a melt. The growth setup comprises a crucible a heating element that is arranged and configured for melting a starting material that is held in the crucible to a melt, and a thermal insulation lid for covering at least a central part of a melt surface of a melt held in the crucible.

The growth setup according to the invention is suitable for being used for implementing the growth method for growing a bulk single crystal according to the invention. The growth setup according to the invention shares the advantages of the growth method according to the invention.

It is an advantage of the growth setup according to the invention that it only requires a small number of components in comparison with other growth setups, e.g., a Czochralski setup that also requires a balance to measure the weight of the growing crystal (or the crucible from which it is being pulled) and crystal rotation.

It is a further advantage of the growth setup according to the invention that by the use of the thermal insulation lid, also such high-quality bulk single crystals can be grown in a convenient manner that cannot or at least not easily be grown with the Czochralski technique.

In particular, by varying, e.g., the thermal insulation lid geometry, the lid material and/or the lid size and/or by varying the arrangement of the thermal insulation lid with respect to the crucible the growth setup can be adjusted according to the needs for growing a particular bulk single crystal. Further, for growing a particular bulk single crystal in a growth process the distance to the melt and/or the tilt of the lid with respect to the melt surface can be varied in a convenient manner, It is beneficial if the thermal insulation lid is or comprises a shutter and is configured such that by opening and closing the shutter the amount of the melt surface that is covered by the thermal insulation lid is adjustable. A thermal insulation lid that is or comprises a shutter can be implemented in various ways.

In an embodiment the shutter comprises two disks arranged one above the other to have the same midpoint. Both disks can have the same diameter but also different diameters. Further, the two disks are arranged one above the other such that they can be rotated relative to each other, such that the shutter can be opened and closed by rotating the disks relative to each other.

Both disks can comprise a plurality of for example evenly shaped perforations, the perforations of both disks being distributed along the circumference of circles having the same diameter. In other embodiments perforations can be arranged for example in certain quadrants of a disks while other quadrants are continuously solid.

In various other embodiments of a thermal insulation lid comprising a shutter, the shutter is implemented by one or more windows that can be opened or closed. By choosing an opening angle of the one or more windows the amount of thermal radiation emitted from the melt surface per time period can be controlled. It is also possible to implement a thermal insulation lid comprising a shutter by means of a thermal insulation lid having a plurality of perforations that each can be closed with a corresponding lid. Such a lid for closing a plurality of perforations can also be made of one piece such that the plurality of perforations can be closed and opened in one step.

It is preferred that the thermal insulation lid is made of a material that is solid and that can withstand the hot environment, including possible thermal shock. Preferably, the thermal insulation lid is made of the same material as the crucible (iridium in the case of $Ba_2ScNbO_6$) or of the same chemical elements as a starting material from which a bulk single crystal shall be grown. For example, in particular when growing a bulk $Ba_2ScNbO_6$ single crystal, the thermal insulation lid can be made of a disc-shaped piece of $Ba_2ScNbO_6$.

The outer diameter of the thermal insulation lid should be smaller than the inner diameter of the crucible, in particular, below the covered crucible top (below the punched Ir disc). Then, when growing a bulk single crystal only a fraction of the melt surface is covered by the lid that is arranged at a distance above the melt surface. An area between the lid and the crucible wall then remains uncovered such that radiated heat is not blocked by the lid. The ratio of covered and uncovered melt surface areas can be used as an additional parameter for designing a temperature distribution in the melt that is best suited for growing a particular bulk single crystal.

In one embodiment the thermal insulation lid is arranged to be centred to the crucible such that the uncovered melt surface area surrounding the covered centre uniformly radiates heat from the melt.

A thermal insulation lid can also be comparatively thick to provide good thermal insulation. Alternatively the thermal insulation lid can also comprise several stacked lids, in one embodiment also with small distances between the lids.

In particular, a thermal insulation lid that is configured for completely covering the crucible can comprise a shutter for adjusting the amount of the melt surface that is covered by the thermal insulation lid while growing a bulk single crystal.

Preferably, the crucible is covered with a punched disc. The punched disc can be placed on the crucible after placing the insulation lid. A mounting of the thermal insulation lid, e.g., an arm attached to the thermal insulation lid, can then extend through the punched hole of the punched disc. A mounting extending through the punched hole can be moved vertically with respect to the punched disc and to the crucible to adjust the distance of the attached thermal insulation lid above a melt surface. Preferably, the crucible is embedded in a thermal insulation, the thermal insulation being close to or in contact with the crucible. The thermal insulation can be arranged below, beside and/or above the crucible.

For example, the crucible can be embedded in $ZrO_2$ and $Al_2O_3$ insulation, wherein $Al_2O_3$ is preferably used with lower growth temperatures or in cooler regions of the growth setup.

The crucible can be an iridium or platinum crucible. In general, any crucible can be used that is configured for holding a starting material and also a melt of this starting material. Consequently, the crucible needs to have a higher melting temperature than the material to be melted. Thus, a suitable crucible is preferably configured to withstand high heating temperatures, e.g., of at least 2200° C., and also the cooling. Also, the crucible should be made of a material that does not react with the starting material.

The crucible of the growth setup can be realised in various shapes and sizes. A larger crucible enables a larger bulk single crystal to be grown. Thus, the size of the crucible can be chosen according to the desired size of the bulk crystal to be grown. In general, it is preferred if the crucible is cylindrically shaped as they can be heated uniformly in a convenient manner. Preferred diameter/height ratios of the crucible fall in the range 0.3-2. For example, the crucible can have an inner diameter of 28 mm and a height of 42 mm.

It can also be advantageous if the crucible is a skull crucible made of a powder comprising at least the same chemical elements as a starting material from which the bulk single crystal shall be grown. For example, if the starting material comprises at least Ba, Sc, Nb, and O and the bulk single crystal to be grown is a bulk $Ba_2ScNbO_6$ single crystal, the skull crucible can be made of a powder comprising at least Ba, Sc, Nb, and O. When using a skull crucible, the starting material typically melts in the central part of the crucible by heating the crucible with a heating element. The outside of the skull crucible is cooled, e.g., using a water-cooled vessel, to prevent melting of the crucible itself. The advantage of the skull crucible is that the crucible no longer needs to have a higher melting temperature than the material to be melted.

The heating element can be an induction heating element, preferably comprising at least one induction heating coil for heating a starting material held in the crucible. Thus when using an induction heating coil, heating is accomplished by radio frequency (RF) induction. Preferably, the induction heating coil is wrapped around the thermal insulation next to the crucible.

BRIEF DESCRIPTION OF THE DRAWINGS

In the following, preferred embodiments of the invention will be described with reference to the figure. In the figures:

FIG. 4: schematically shows an embodiment of a thermal insulation lid with a shutter function being in its open state a) and in its closed state b);

FIG. 5: schematically shows a further embodiment of a thermal insulation lid with a shutter function being in its open state a) and in its closed state b);

DETAILED DESCRIPTION

Figure 1:
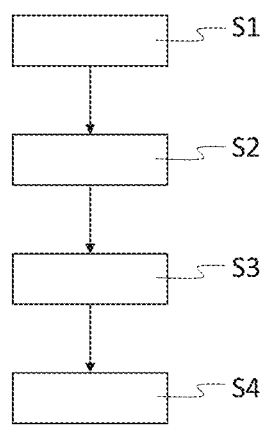
FIG. 1: shows a flow diagram representing a method for growing a bulk single crystal.

FIG. 1 shows a flow diagram representing a method for growing a bulk single crystal. The growth method can be conducted using, e.g., a growth setup as described with respect to FIG. 3.

In a first step S1, a starting material is inserted into a crucible. The starting material is provided in dried powder form with a purity of 99.99%. In various other embodiments of the method the starting material comprises impurities in the 1% range and dopants in the 5% range. It is advantageous if before inserting the starting material into the crucible a powder mixture is produced from the starting material, e.g., including weighing, mixing and calcining the powders of the different chemical species.

Here, the starting material is inserted into the crucible as a loose powder. Before melting the loose powder can be compacted inside the crucible. However, in various other embodiments it is preferred that the starting material is compacted before inserting into the crucible. Compacting the starting material before inserting the starting material into the crucible is often preferred because it allows the crucible to be filled more efficiently with starting material and also enables the starting material in the crucible to be more efficiently melted.

The starting material can comprise, e.g., oxygen in combination with a cation species that can assume multiple oxidation states. In particular, it is preferred if the starting material comprises at least Ba, Sc, Nb and O.

After inserting, the starting material is melted in step S2 in the crucible by heating the starting material, e.g., with a heating element. If the starting material is inserted into the crucible in compacted form, e.g., in the form of a cylindrical bar, the bar sinks to the lower part of the crucible while melting.

After melting the starting material to a melt, a thermal insulation lid is arranged in step S3 at a distance above a melt surface of said melt to block radiation emitted from the melt surface. In particular, the thermal insulation lid is arranged above the melt surface such that at least a central part of the melt surface is covered by the lid. Preferably, the lid is arranged close to the melt surface, e.g. within the range of 1 mm and 10 mm. However, in various embodiments it is beneficial if the thermal insulation lid is arranged above the melt surface at a distance between 1 mm and 100 mm. The thermal insulation lid can also be arranged above the melt or unmolten starting material before melting the starting material or while melting the starting material in further embodiments.

With the thermal insulation lid arranged at a distance above the melt surface a bulk single crystal is grown from the melt in step S4. Hereby, crystals nucleate at the crucible wall and grain-selection and continuous grain enlargement towards the central part of the crucible occur such that the bulk single crystal grows from the crucible wall towards the central region of the crucible.

Crystal growth is achieved by controllably cooling the melt with the thermal insulation lid arranged above the melt surface. Controllably cooling the melt can be performed passively, e.g., by reducing the heat provided by a heating element over a predefined period of time and/or can be performed actively, e.g., by directing an inert gas flux onto the melt surface.

While conducting the steps of the method for growing a bulk single crystal as described above, preferably, the crucible is arranged in an inert gas atmosphere, e.g., argon or a nitrogen atmosphere, preferably, under ambient pressure.

Figure 2:
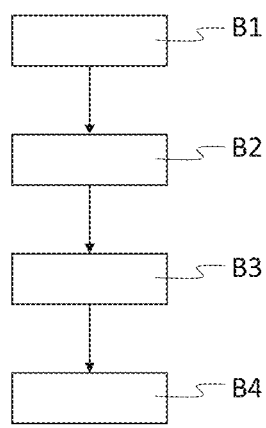
FIG. 2: shows a flow diagram representing a method for growing a bulk $Ba_2ScNbO_6$ single crystal.

FIG. 2 shows a flow diagram representing a method for growing a bulk $Ba_2ScNbO_6$ single crystal. The method of growing a bulk $Ba_2ScNbO_6$ single crystal can be conducted using, e.g., a growth setup as described with respect to FIG. 3. The growth method described with respect to FIG. 2 constitutes a variant of the growth method described with respect to FIG. 1.

In the growth method represented by the flow diagram of FIG. 2, a starting material comprising at least Ba, Sc, Nb and O is provided in dried powder form with a purity of 99.99%. The starting material can also comprise dopants, e.g., MgO and/or CaO at a content of less than 5 mol %. The starting material is then inserted in step B1 into the crucible. In various embodiments before inserting the starting material into the crucible, a powder mixture is produced from the starting material comprising at least Ba, Sc, Nb and O. One possible way of producing the powder mixture from the starting material is to weigh, mix and calcine the dried powders. Calcining the starting material can be performed, e.g., in air at 1300° C. for 12 hours. The powder mixture produced from the starting material is then inserted into the crucible. Often it is beneficial, in particular, for the filling process and the subsequent melting, that the starting material or a powder mixture produced therefrom is compacted. For example, the starting material can be compacted to a cylindrically shaped bar that is then inserted into the crucible. One possible way of compacting the starting material is to use cold isostatic pressing at 0.2 GaP.

The starting material held in the crucible is then melted in step B2 by heating the starting material. For melting the starting material to a melt, the crucible is heated at least to the melting temperature of a bulk $Ba_2ScNbO_6$ single crystal. To be well above the melting temperature of a bulk $Ba_2ScNbO_6$ single crystal the crucible can be heated, e.g., to a temperature of 2200° C.

After melting the starting material, a thermal insulation lid is arranged in step B3 at a distance above a melt surface of said melt to block radiation emitted from the melt surface. In particular, the thermal insulation lid is arranged above the melt surface such that at least a central part of the melt surface is covered by the lid. Preferably, the lid is arranged close to the melt surface, e.g., within the range of 1 mm and 10 mm. However, in various embodiments it is beneficial if the thermal insulation lid is arranged above the melt surface at a distance between 1 mm and 100 mm. The thermal insulation lid can also be arranged above the melt or unmolten starting material before melting the starting material or while melting the starting material in further embodiments.

The melt held in the crucible is then controllably cooled—passively and/or actively—for growing B4 a bulk $Ba_2ScNbO_6$ single crystal from the melt. During growth of the bulk $Ba_2ScNbO_6$ single crystal the thermal insulation lid is arranged above the melt surface to block thermal radiation emitted from the melt surface and to produce a specific temperature distribution favouring crystal growth. Such a temperature distribution beneficial for crystal growth can include a temperature gradient with lower (colder) temperatures close to the crucible wall and higher (hotter) temperatures in the central part of the crucible.

With the growth methods as described with respect to FIG. 1 and, in particular, with the variant of this growth method that is described with respect to FIG. 2, a bulk $Ba_2ScNbO_6$ single crystal can be grown having a volume larger than 5 mm×5 mm×5 mm (length×width×height). Consequently, from bulk $Ba_2ScNbO_6$ single crystals grown with the methods described with respect to FIGS. 1 and 2, $Ba_2ScNbO_6$ single crystal substrates can be fabricated and used in the electronics industry for fabricating electronic devices.

Figure 3:
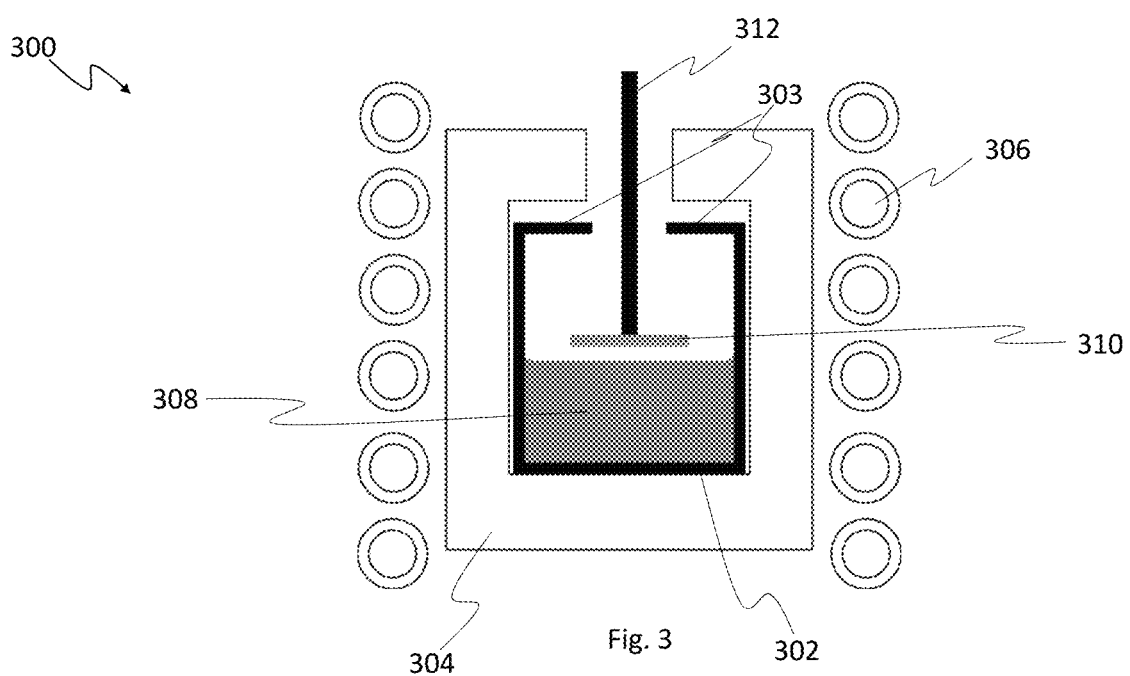
FIG. 3: schematically shows an embodiment of a growth setup for growing a bulk single crystal.

FIG. 3 schematically shows a growth setup 300 in a longitudinal sectional view for growing a bulk single crystal. The growth setup 300 can be used for implementing the growth methods as described with respect to FIGS. 1 and 2.

The growth setup comprises a crucible 302 that is embedded in a thermal insulation 304. The thermal insulation 304 can comprise, e.g., $ZrO_2$ and $Al_2O_3$. The crucible itself can be made of, e.g., iridium or platinum. Preferably, the crucible 302 has a cylindrical shape. However, the crucible 302 can also be realised in different shapes, e.g., the crucible 302 can have a hemispherical shape or the crucible 302 can be cube-shaped. With larger crucibles larger bulk single crystals can be grown. Thus, preferably for growing a bulk single crystal having a specific size a respective crucible is selected that also is not too large as too save energy needed for melting the starting material. For growing a bulk single crystal having a volume of about 15 mm×15 mm×15 mm (length×width×height), e.g., a crucible can be used having an inner diameter of 30 mm and a height of 50 mm.

The crucible 302 is covered with a punched disc 303 that, preferably, is made of the same material as the crucible 302, e.g., iridium or platinum. The punched disc 303 serves for blocking thermal radiation emitted from the melt surface. The punched disc 303 is optional and is not mandatory for growing a bulk single crystal, e.g., by implementing one of the growth methods as described with respect to FIG. 1 or 2.

The growth setup 300 further comprises a heating element 306 that is arranged and configured for melting a starting material that is held in the crucible 302 and melted. In particular, the heating element 306 comprises an induction heating coil that is wrapped around the crucible 302. Thus, heating the starting material to a melt is accomplished by radio frequency (RF) induction mainly into the crucible and crucible lid.

In the growth setup 300 a melt 308 is shown. At a distance above the melt 308 held inside the crucible 302 a thermal insulation lid 310 is arranged that at least partly covers part the surface of the melt 308. In particular, the thermal insulation lid 310 is arranged and configured for influencing and controlling the temperature distribution in the melt 308 held inside the crucible 302 to favor crystal growth from the crucible wall towards the crucible center. The thermal insulation lid 310 can comprise a shutter as described with respect to FIGS. 4a and 4b and FIGS. 5a and 5b and FIGS. 9, 10 and 11. With a thermal insulation lid comprising a shutter, the amount of the melt surface that is covered by the thermal insulation lid while growing a bulk single crystal can be adjusted. The thermal insulation lid 310 can be made of, e.g., iridium. In particular, if the starting material comprises Ba, Sc, Nb and O and the growth setup 300 is used for growing a bulk $Ba_2ScNbO_6$ single crystal, the thermal insulation lid 310 can be made of a disc-shaped piece of $Ba_2ScNbO_6$.

The thermal insulation lid 310 is attached to an arm 312 as a mounting with which the thermal insulation lid 310 can be lifted up or brought closer to the surface of the melt 308.

The arm extends vertically though the hole of the punched disc 303 such that the thermal insulation lid attached to the arm can be lifted. For example, the arm can have a screw thread at its end outside the crucible and can moved manually. It is also possible that the arm can be lifted automatically, e.g., with an electrically driven motor that is connected to the arm.

This growth setup is in particular useful for growing a bulk $Ba_2ScNbO_6$ single crystal, especially with the method described with respect to FIG. 2.

FIGS. 4a, 4b and 5a, 5b schematically show two different embodiments of a thermal insulation lid having a shutter function. The thermal insulation lids having a shutter function as described with respect to FIGS. 4a, 4b and 5a, 5b can be used as a thermal insulation lid in a growth setup as described with respect to FIG. 3. By opening and closing the shutter the amount of the melt surface that is covered by the thermal insulation can be adjusted. Correspondingly, the amount of thermal radiation that is allowed to escape from the crucible can be adjusted with the shutter. The shutter can be implemented in different ways of which FIGS. 4a, 4b and 5a, 5b only show simplified selected examples. In particular, the shutter geometry of the thermal insulation lid can be adapted to specific growth scenarios.

The thermal insulation lid 400 having a shutter function as shown in FIGS. 4a and 4b comprises two disks 402, 404 arranged one above the other to have the same midpoint. Both disks can have the same diameter but also different diameters as depicted in FIGS. 4a and 4b work. Both disks comprise a plurality of circularly shaped perforations 406, 408, the perforations 406, 408 of both disks 402, 404 being distributed along the circumference of circles having the same diameter. Further, the two disks 402, 404 are arranged one above the other such that they can be rotated relative to each other. As shown in FIG. 4a the two disks 402, 404 can then be arranged such that the perforations of the one disk 402 are congruent with the perforations of the other disk 404. Then the shutter is open and the amount of the melt surface that is covered by the thermal insulation is minimum. In FIG. 4b the opposite is the case, namely, the two disks 402, 404 are arranged one above the other such that the perforations 406, 408 of the two disks 402, 404 do not overlap such that the amount of the melt surface that is covered by the thermal insulation is maximum. Of course the two disks 402, 404 can be arranged one above the other to have an overlapping state in between completely open and completely closed.

Also a thermal insulation lid having a shutter function can have more perforations, perforations of different sizes and shapes and a plurality of perforations arranged in a different pattern. For example, in a pattern as shown in FIGS. 5a and 5b. Comparable to the thermal insulation lid 400 as described with respect to FIGS. 4a and 4b, the thermal insulation shutter 500 of FIGS. 5a and 5b comprises two disks 502, 504 each having a plurality of perforations 506, 508. As described with respect to FIGS. 4a and 4b, the two disks 502, 504 can be rotated relative to each other to close or open the shutter. Hereby, FIG. 5a depicts the thermal insulation lid 500 having a shutter in its open state and FIG. 5b depicts the thermal insulation lid 500 having a shutter in its closed state.

Here, the perforations 506, 508 are triangularly shaped with one of the vertices being the closest to the rim of the disks 502, 504. For a particular design of a temperature distribution of the melt it can be of advantage if each of the triangles are rotated by 180° such that the shortest edge is the closest to the rim of the disks 502, 504.

In various other embodiments of a thermal insulation lid comprising a shutter, the shutter is implemented by one or more windows that can be opened or closed. By choosing an opening angle of the one or more windows the amount of thermal radiation emitted from the melt surface per time period can be controlled.

It is also possible to implement a thermal insulation lid comprising a shutter by means of a thermal insulation lid having a plurality of perforations such that each can be closed by a corresponding lid. Such a lid for closing a plurality of perforations can also be made of one piece such that the plurality of perforations can be closed and opened in one step.

Figure 6:
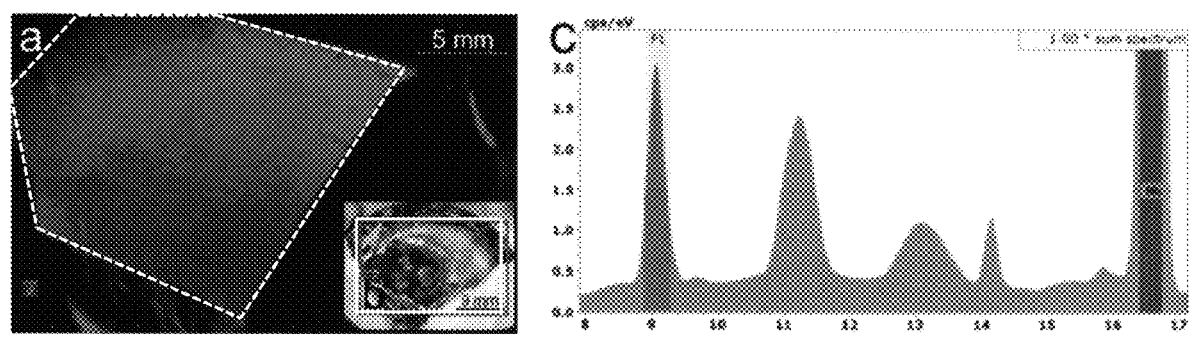
FIG. 6: shows in a) a grey scale intensity plot of a selected Bragg reflection produced from the bulk $Ba_2ScNbO_6$ single crystal shown in a photograph in b) and in c) the sum spectra collected within the bulk $Ba_2ScNbO_6$ single crystal area.

FIG. 6 shows in a) a grey scale intensity plot of a selected Bragg reflection produced from the bulk $Ba_2ScNbO_6$ single crystal photographed in b). The measurement shown in a) was performed on the bulk $Ba_2ScNbO_6$ single crystal within the area indicated by the white box in b). The bulk $Ba_2ScNbO_6$ single crystal was grown from the melt using an iridium crucible with the method as described with respect to FIG. 2 and has a volume of 17 mm×17 mm×15 mm (length×width×height).

The region in a) surrounded by the white dashed lines represents the single crystal region of the bulk $Ba_2ScNbO_6$ single crystal. This bulk $Ba_2ScNbO_6$ single crystal shown in FIG. 6b) is thus part of a larger multicrystalline volume. Slight differences in Bragg peak intensity are related to topographic effects, since the bulk $Ba_2ScNbO_6$ single crystal was measured in the as-grown state. In c) the sum spectra collected within the single-crystal area are shown.

Figure 7:
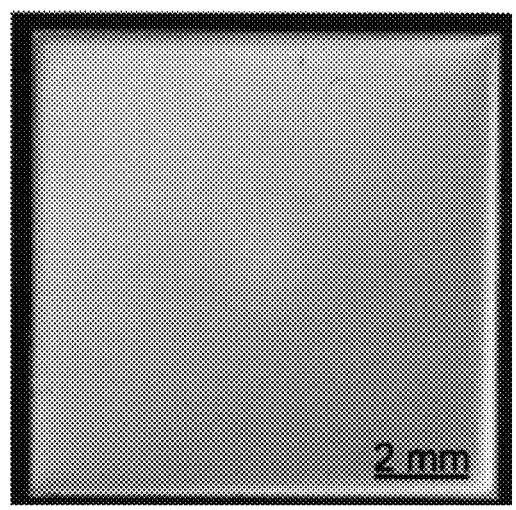
FIG. 7: shows a chemo-mechanically polished (001)-oriented $Ba_2ScNbO_6$ single crystal substrate with a lateral extent of 10 mm.

FIG. 7 shows a differential interference contrast (DIG) micrograph of a chemo-mechanically polished (001)-oriented $Ba_2ScNbO_6$ single crystal substrate with a surface area of 10×10 mm². The $Ba_2ScNbO_6$ single crystal substrate was prepared from the bulk $Ba_2ScNbO_6$ single crystal shown in FIG. 6b).

Figure 8:
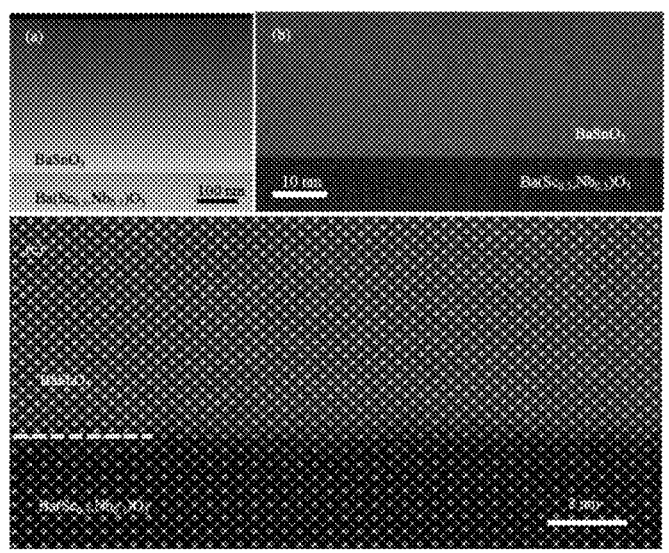
FIG. 8: shows a transmission electron microscope (TEM) micrograph of a structure comprising a $Ba_2ScNbO_6$ single crystal substrate and a $BaSnO_3$ crystal layer epitaxially grown on top.

FIG. 8 shows transmission electron microscope (TEM) micrographs at different magnifications in a), b) and c) of a multilayer structure comprising a $Ba_2ScNbO_6$ single crystal substrate and a 250 nm thick undoped $BaSnO_3$ crystal layer epitaxially grown on top of it followed by a 130 nm thick La-doped $BaSnO_3$ layer, doped to yield a free electron concentration of $3\times10^{19}$ cm$^{-3}$. In particular, in c) it can be clearly seen that at the interface (indicated by the dashed line) between the $Ba_2ScNbO_6$ single crystal substrate and the $BaSnO_3$ crystal layer of the multilayer structure has high structural perfection. This due to the high structural quality of the $Ba_2ScNbO_6$ single crystal substrate itself. From the multilayer structure shown comprising the single crystalline $Ba_2ScNbO_6$ substrate and a 250 nm thick undoped $BaSnO_3$ crystal layer followed by a 130 nm thick La-doped $BaSnO_3$ layer having an average threading dislocation density of less than $10^8$ dislocations per cm² and a full width at half maximum (FWHM) of its rocking curve that is equal to 23 arcsec (0.006°). Electrical transport measurements on this film made using the Hall effect method indicate that the layer contains a concentration of $3\times10^{19}$ electrons cm$^{-3}$ and that the mobility of these electrons at room temperature exceeds 190 cm²V$^{-1}$s$^{-1}$. This mobility is higher than any report in the literature and is indicative of the electron mobility that can be achieved in electronic devices utilizing these films, e.g., a field-effect transistor.

Figure 9:
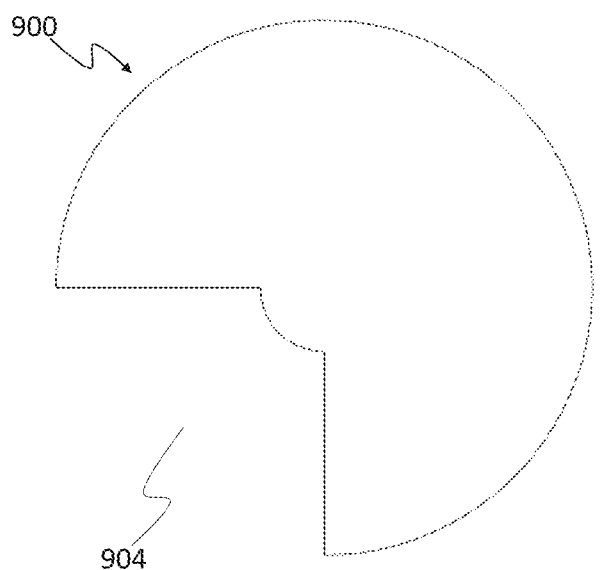
FIG. 9: schematically shows a disk of a further embodiment of a thermal insulation lid with a shutter function.
Figure 10:
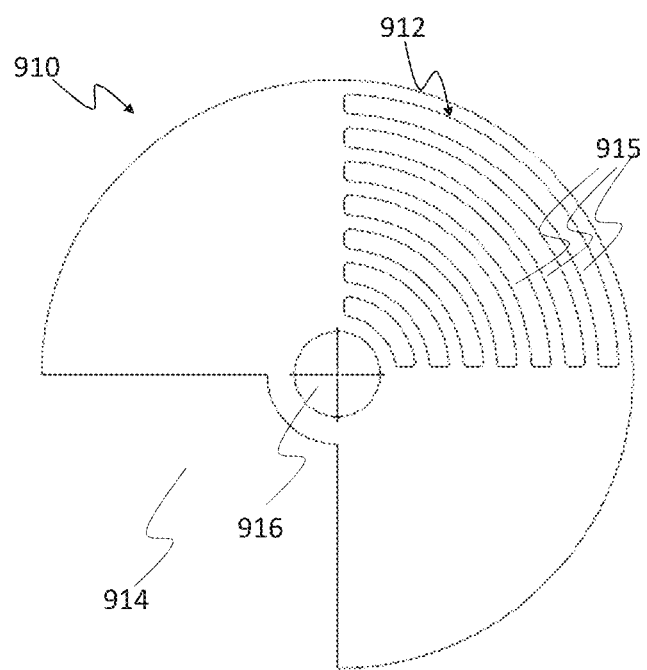
FIG. 10: schematically shows a disk of a further embodiment of a thermal insulation lid with a shutter function.
Figure 11:
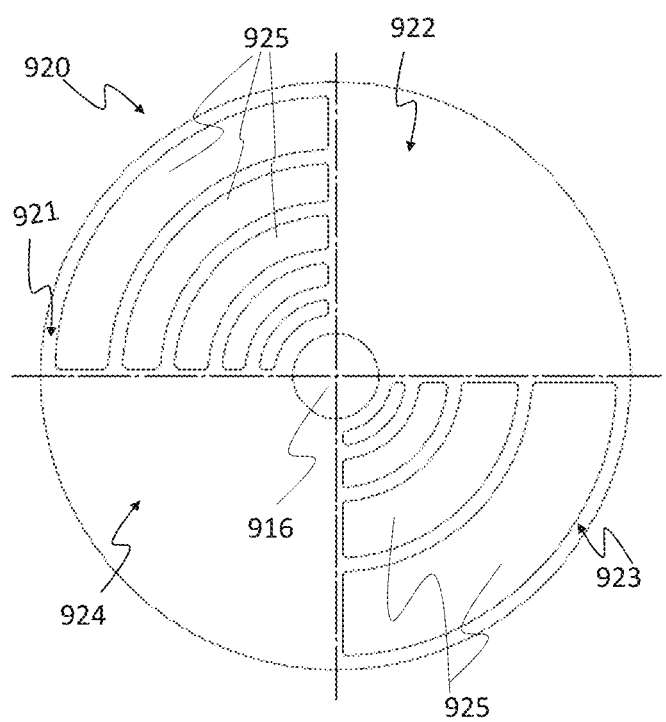
FIG. 11: schematically shows a disk of a further embodiment of a thermal insulation lid with a shutter function.

FIGS. 9, 10 and 11 show embodiments of disks, which are used as disks of an embodiment of a thermal insulation lid having a shutter function. As in FIGS. 4a, 4b, 5a and 5b each thermal insulation lid comprises two disks with identical shape, which can be rotated with respect to each other to open and close the shutter. By appropriate design of the holes and openings in such lids as well as the mutual rotation between them, the temperature profile of the melt can be controlled, which in turn effects the nucleation and growth of the crystal in the crucible.

FIG. 9 shows schematically one of two disks 900 of identical shape, which function as a thermal insulation lid having a shutter function. The disk 900 extends over three quadrants of a circle. The fourth quadrant 904 is left open except for a small inner circle for mounting the disk forming an opening such that when arranged at a distance above a melt surface, thermal radiation emitted from the melt surface can escape through the opening, when the fourth quadrants 904 of both disks are arranged at least partly overlapping each other. In one example, the disk nearer to the melt stays fixed on top of the crucible while the disk arranged above can be rotated with respect to the other disk. In other examples both disks can be rotated. When the two disks 900 implementing a thermal insulation lid are arranged congruently, the opening is maximum. By further rotating the disks with respect to each other the area of the opening decreases such that the amount of thermal radiation that can escape is reduced. The shutter can be closed by arranging the two disks with respect to each other such that the opening in the fourth quadrant 904 of each of the respective disks 900 is completely covered by the respective other disk. If the crucible that shall be covered by the thermal insulation lid comprising the two disks 900 has an inner diameter of 42 cm, the disks of the thermal insulation lid, too, can have a diameter of 42 cm. Preferably, each of the disks 900 has a thickness of 1.5 cm.

FIG. 10 shows schematically one of two disks 910 of identical shape, which function as a thermal insulation lid having a shutter function. The disk 910 is merely constructed and functions like the disk shown in FIG. 9. Thus only differences to the disk 900 of FIG. 9 are described. Additionally to the opening in the fourth quadrant 914 disk 910 comprises in the second quadrant 912 which is opposite to the opening in the fourth quadrant, a plurality of elongated curved perforations 915 that are arranged evenly spaced in radial direction of the disk 910. A thermal insulation lid comprising two of the disks 910 shown, can have a plurality of opening states depending on the arrangement of the disks with respect to each other. For example, the opening and the perforations 915 can be fully covered or left uncovered by the respective other disk. It is also possible that only the perforations 915 of each disk are open, when the opening of fourth quadrant 914 of the respective other disk overlaps the second quadrant 912 with the perforations 915. Furthermore, the disk 910 has a central opening 916 for receiving a mounting for the thermal insulation lid.

FIG. 11 shows schematically a further embodiment of one of two disks 920 of identical shape, which function as a thermal insulation lid having a shutter function. The disk 920 is merely constructed and functions like the disk shown in FIG. 9. Thus only differences to the disk 900 of FIG. 9 are described. The fourth quadrant 924 and the second quadrant 922 in this embodiment do not have openings or perforations. Instead in the first quadrant 921 and the third quadrant 923 a plurality of elongated curved perforations 925 that are arranged evenly spaced in radial direction of the disk 920 is arranged, wherein the perforations 925 nearer to the centre of the disk 920 are smaller in thickness than the perforations 925 farer to the centre. As the disk 910 of FIG. 10 the disk 920 has a central opening 926 for receiving a mounting for the thermal insulation lid.

The invention claimed is:

1. A single crystalline $Ba_2ScNbO_6$ substrate having a diameter in lateral extent that is equal to or larger than 6 mm.

2. A (multi)layer structure comprising the single crystalline $Ba_2ScNbO_6$ substrate of claim 1 and one or more crystal layers grown on said $Ba_2ScNbO_6$ substrate.

3. The (multi)layer structure of claim 2, wherein the one or more crystal layers comprise a perovskite, preferably at least one of the perovskites $BaSnO_3$, $LaInO_3$, $BiScO_3$, $PbZrO_3$, $SrZrO_3$, $SrHfO_3$, $PrInO_3$, $LaScO_3$, $SrSnO_3$, $BaHfO_3$, $LaLuO_3$, $CeLuO_3$, $PrLuO_3$, $NdLuO_3$, $CeYbO_3$, $PrYbO_3$, or $BaZrO_3$, and/or the one or more crystal layers comprise at least one of the perovskite solid solutions $PbZr_{1-x}Ti_xO_3$ (PZT), $PbCa_{1-x}Ti_xO_3$ (PCT), or $Ba_{1-x}Sr_xSnO_3$, wherein x is a number between 0 and 1, and/or the one or more crystal layers comprise at least one of the relaxor-ferroelectric solid solutions $PbMg_{1/3}Nb_{1/2}O_3$—$PbTiO_3$ (PMN-PT), $PbZn_{1/3}Nb_{2/3}O_3$—$PbTiO_3$ (PZN-PT), and $PbIn_{1/2}Nb_{1/2}O_3$—$PbMg_{1/3}Nb_{2/3}O_3$—$PbTiO_3$ (PIN-PMN-PT).

4. The (multi)layer structure of claim 2, wherein one of the one or more crystal layers is a $BaSnO_3$ crystal layer that is grown directly on the $Ba_2ScNbO_6$ substrate, the $BaSnO_3$ crystal layer having an average threading dislocation density of less than $10^8$ dislocations per $cm^2$ and/or an electron mobility larger than 190 $cm^2V^{-1}s^{-1}$ and/or a full width at half maximum (FWHM) of its rocking curve that is less than or equal to 23 arcsec (0.006°).

5. An electronic device comprising a (multi)layer structure according to claim 2.

6. A method for fabricating a $Ba_2ScNbO_6$ substrate according to claim 1 from a bulk $Ba_2ScNbO_6$ single crystal having a cross-sectional area that is equal to or larger than 6 mm×6 mm, wherein the method comprises the steps of
inserting a starting material comprising at least Ba, Sc, Nb and O into a crucible,
melting the starting material in the crucible by heating the starting material,
arranging a thermal insulation lid at a distance above a melt surface of said melt such that at least a central part of the melt surface is covered by the lid, and
growing the bulk $Ba_2ScNbO_6$ single crystal from the melt by controllably cooling the melt with the thermal insulation lid arranged above the melt surface such that the bulk $Ba_2ScNbO_6$ single crystal has a cross-sectional area that is equal to or larger than 6 mm×6 mm.

7. The method according to claim 6, wherein the cooling of the melt is passively controlled by reducing heat provided by a heating element over a predefined period of time and/or actively controlled.

8. The method according to claim 6, wherein the distance at which the thermal insulation lid is arranged above the melt surface of said melt is between 1 mm and 100 mm.

9. The method according to claim 8, wherein the distance at which the thermal insulation lid is arranged above the melt surface of said melt is between 5 mm and 20 mm.

10. The method according to claim 8, wherein the thermal insulation lid is arranged at a distance of 10 mm above the melt surface.

11. The method according to claim 6, wherein the starting material is compacted before melting and preferably before inserting the starting material in the crucible.

12. The method according to claim 6, wherein the crucible is arranged in an inert gas atmosphere.

13. The method according to claim 12, wherein the crucible is arranged in an inert gas atmosphere of argon or nitrogen.

14. The method according to claim 6, wherein the starting material additionally comprises MgO and/or CaO at a content of less than 5 mol % and the resulting bulk $Ba_2ScNbO_6$ single crystal is doped with Mg and/or Ca.

15. The method according to claim 6, additionally comprising separating the bulk $Ba_2ScNbO_6$ single crystal from a multicrystalline or polycrystalline matrix that at least partly surrounds the $Ba_2ScNbO_6$ single crystal.

16. The method according to claim 6, additionally comprising cutting a slice of the bulk $Ba_2ScNbO_6$ single crystal.

17. The method according to claim 16, additionally comprising fabricating a $Ba_2ScNbO_6$ substrate from the slice having a diameter in lateral extent that is equal to or larger than 6 mm.

18. A bulk $Ba_2ScNbO_6$ single crystal having a cross-sectional area that is equal to or larger than 6 mm×6 mm.

19. The bulk $Ba_2ScNbO_6$ single crystal of claim 18, having cubic symmetry and a lattice parameter of 412 pm.

20. The bulk $Ba_2ScNbO_6$ single crystal of claim 18, having a melting point at 2165 +/−30° C. in inert gas atmosphere at ambient pressure.

* * * * *